(12) United States Patent
Lee et al.

(10) Patent No.: US 11,233,097 B2
(45) Date of Patent: Jan. 25, 2022

(54) DISPLAY DEVICE INCLUDING DUMMY PIXELS WITH TRANSMISSIVE AREAS

(71) Applicant: SAMSUNG DISPLAY CO., LTD., Yongin-si (KR)

(72) Inventors: Won Se Lee, Seoul (KR); Dong Wook Kim, Asan-si (KR); Ae Shin, Seoul (KR); Su Kyoung Kim, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/804,532

(22) Filed: Feb. 28, 2020

(65) Prior Publication Data

US 2020/0235191 A1 Jul. 23, 2020

Related U.S. Application Data

(63) Continuation of application No. 15/651,680, filed on Jul. 17, 2017, now Pat. No. 10,615,229.

(30) Foreign Application Priority Data

Jul. 25, 2016 (KR) .......................... 10-2016-0094281

(51) Int. Cl.
*H01L 27/00* (2006.01)
*H01L 27/32* (2006.01)
(Continued)

(52) U.S. Cl.
CPC .......... *H01L 27/3223* (2013.01); *B60K 35/00* (2013.01); *H01L 27/326* (2013.01);
(Continued)

(58) Field of Classification Search
None
See application file for complete search history.

(56) References Cited

U.S. PATENT DOCUMENTS

| 8,253,883 B2 | 8/2012 | Mimura |
| 8,674,904 B2 | 3/2014 | Taguchi et al. |

(Continued)

FOREIGN PATENT DOCUMENTS

| EP | 2980854 | 2/2016 |
| KR | 10-0852414 | 8/2008 |

OTHER PUBLICATIONS

"Trapezoid." Merriam-Webster.com. 2020. https://www.merriam-webster.com (Oct. 23, 2020). (Year: 2020).*

(Continued)

*Primary Examiner* — Reema Patel
(74) *Attorney, Agent, or Firm* — F. Chau & Associates, LLC

(57) ABSTRACT

A display device includes: a substrate including a display area for displaying an image and a peripheral area positioned adjacent to the display area; a plurality of normal pixels disposed within the display area on the substrate, where each normal pixel includes a first transmissive area and a pixel area disposed adjacent the first transmissive area; and a dummy pixel disposed within the display area on the substrate, adjacent to a curved section of the peripheral area, and disposed between the peripheral area and the plurality of pixels. The dummy pixel includes: a second transmissive area; and a wire area disposed adjacent the second transmissive area.

18 Claims, 17 Drawing Sheets

(51) Int. Cl.
　　　*H01L 51/00*　　　(2006.01)
　　　*B60K 35/00*　　　(2006.01)
(52) U.S. Cl.
　　　CPC ...... *H01L 27/3211* (2013.01); *H01L 27/3272* (2013.01); *H01L 27/3276* (2013.01); *H01L 51/0097* (2013.01); *B60K 2370/331* (2019.05); *H01L 2251/5338* (2013.01)

(56) References Cited

U.S. PATENT DOCUMENTS

| | | | |
|---|---|---|---|
| 9,311,855 B2 * | 4/2016 | Jung | ................ G06F 1/163 |
| 10,615,229 B2 * | 4/2020 | Lee | ................ H01L 27/3276 |
| 2009/0033215 A1 | 2/2009 | Horikiri et al. | |
| 2009/0102824 A1 | 4/2009 | Tanaka et al. | |
| 2009/0115933 A1 | 5/2009 | Mimura | |
| 2011/0012816 A1 * | 1/2011 | Kang | ................ H01L 27/326 |
| | | | 345/76 |
| 2011/0298953 A1 * | 12/2011 | Nakamura | ........... H04N 5/3572 |
| | | | 348/241 |
| 2012/0280215 A1 | 11/2012 | Choi et al. | |
| 2014/0312321 A1 | 10/2014 | Yoo et al. | |
| 2015/0091016 A1 | 4/2015 | Chen et al. | |
| 2015/0198842 A1 | 7/2015 | Kwak et al. | |
| 2016/0013260 A1 * | 1/2016 | Ahn | ................ H01L 27/3246 |
| | | | 257/40 |
| 2018/0026080 A1 | 1/2018 | Lee et al. | |

OTHER PUBLICATIONS

"Quadrangle." Merriam-Webster.com. 2020. https://www.merriam-webster.com (Oct. 23, 2020). (Year: 2020).*
European Search Report dated Dec. 15, 2017 in corresponding European Application No. 17182917.9.
Ex Parte Quayle Office Action dated Apr. 4, 2019 in corresponding U.S. Appl. No. 15/651,680.

* cited by examiner

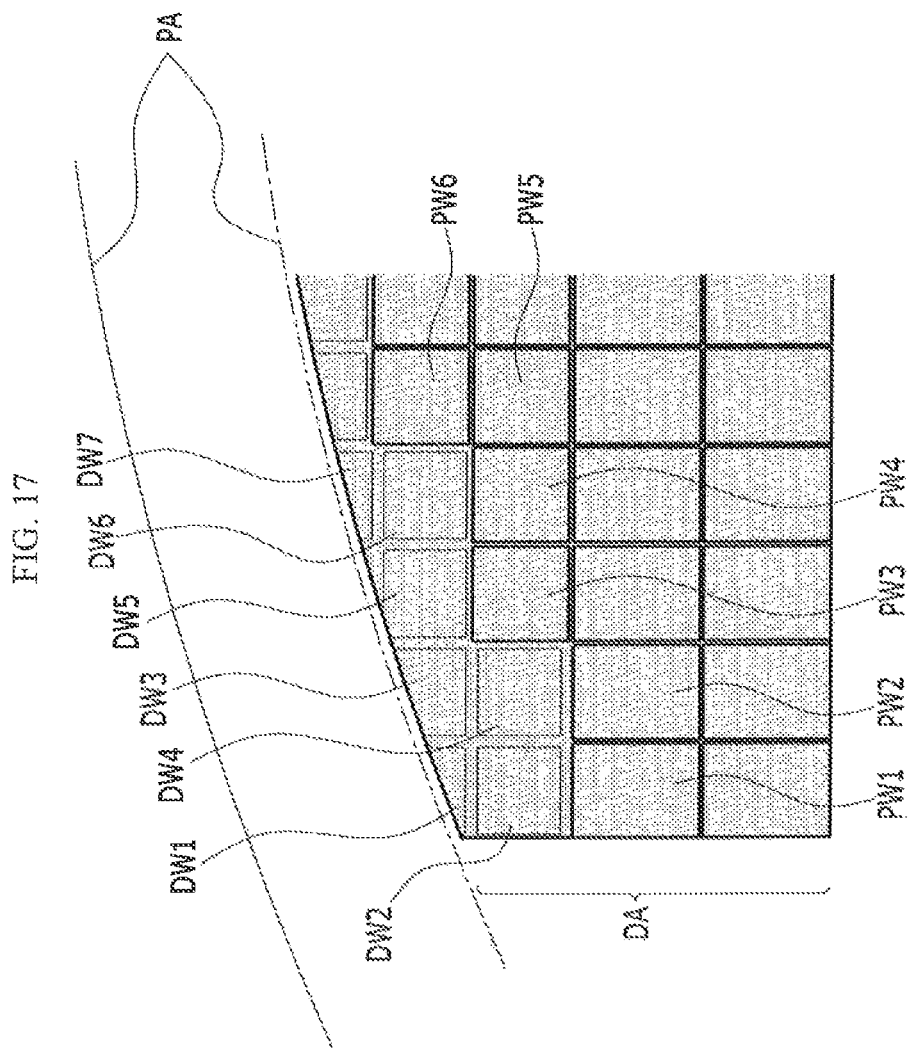

DISPLAY DEVICE INCLUDING DUMMY PIXELS WITH TRANSMISSIVE AREAS

CROSS-REFERENCE TO RELATED APPLICATION

This application is a continuation application of U.S. patent application Ser. No. 15/651,680 filed Jul. 17, 2017, which claims priority to Korean Patent Application No. 10-2016-0094281 filed in the Korean Intellectual Property Office on Jul. 25, 2016, the disclosures of which are incorporated by reference in their entirety herein.

BACKGROUND

(a) Technical Field

The present disclosure relates to a display device.

(b) Discussion of Related Art

Display devices may include a liquid crystal display (LCD), a plasma display panel (PDP), an organic light emitting diode (OLED) display, a field emission display (FED), and an electrophoretic display device.

An OLED display includes two electrodes and an organic emission layer interposed therebetween. Electrons injected from one electrode and holes injected from the other electrode are bonded to one another in the organic emission layer to form excitons, and light is emitted while the excitons discharge energy.

Unlike an LCD, the OLED device has self-luminance characteristics and does not require a separate light source. Thus, OLE device can have a decreased thickness and weight. Further, the OLED device exhibits a high quality characteristic, such as low power consumption, high luminance, and a high response rate.

A recently developed display device includes a transmissive area that allows external light to pass through the transmissive area. This type of display device may be referred to as a transparent display device. However, due to the transmissive area, the internal structure of the transparent display device may be viewed from the outside.

SUMMARY

At least one embodiment of the present inventive concept provides a display device where pixels of a display area of the display device disposed at a border of the display area have a step shape to prevent them from being viewed from the outside.

An exemplary embodiment of the inventive provides a display device, including: a substrate including a display area for displaying an image and a peripheral area positioned adjacent the display area; a plurality of normal pixels disposed within the display area on the substrate, where each normal pixel includes a first transmissive area and a pixel area disposed adjacent the first transmissive area; and a dummy pixel disposed within the display area on the substrate, adjacent to a curved section of the peripheral area, and disposed between the peripheral area and the plurality of pixels. The dummy pixel includes: a second transmissive area; and a wire area (e.g., a dummy wire area) disposed adjacent the second transmissive area.

The second transmissive area may have a quadrangular plane shape.

The second transmissive area may have a rectangular plane shape.

The wire area may include a wire.

In an embodiment, the second transmissive area extends in a first direction, and the wire extends in the first direction.

The wire may include a plurality of parallel wire segments.

The wire may include a plurality of wire segments that are electrically connected to one another.

The wire may have a shape bent two or more times.

In an embodiment, the second transmissive area is extended in a first direction, and the dummy wire is extended in a second direction crossing the first direction.

In an embodiment, the second transmissive area is extended in a first direction, and the wire is inclined at an angle with respect to the first direction.

The wire may be connected to at least one of a plurality of signal lines and a plurality of power lines positioned in the peripheral area.

The plurality of power lines may include a driving power line and a common power line.

The pixel area may include a thin film transistor including a plurality of electrode members positioned on different layers on the substrate.

The dummy wire may be positioned on the same layer as that of any one of the plurality of electrode members.

The plurality of electrode members may include a light blocking film positioned on the substrate, a source electrode and a drain electrode, and a gate electrode overlapping the light blocking film and disposed between the source and drain electrodes.

At least some of the plurality of normal pixels may be adjacent to the curved section of the peripheral area and disposed in a step shape.

The pixel area may include: a first electrode positioned on the substrate; a second electrode positioned on the first electrode; and an organic emission layer positioned between the first electrode and the second electrode.

The second transmissive area may include a buffer layer disposed on the substrate, and a transparent metal layer disposed on the buffer layer.

The transparent metal layer may be positioned on the same layer as that of the second electrode.

The pixel area may include a plurality of sub-pixels for emitting light of different colors.

A display device according to an exemplary embodiment of the invention includes a plurality of normal pixels disposed in a display area of the display device, where a subset of the pixels are arranged in a step shape that is adjacent a curved section of peripheral area of the display device; and a plurality of dummy pixels arranged on top of the subset of pixels inside the display area. Each pixel includes a first area adjacent a second area, where the first area includes a transmissive area, the second area of the normal pixels includes an organic light emitting diode (OLED), and the second area of the dummy pixel includes only a wire without an OLED.

The wire may be bent several times to fill the second area of the dummy pixel.

The display device may further include a power line providing a constant voltage to the wire.

In an embodiment, each normal pixel further includes: a light blocking layer, a source electrode, a drain electrode, and a gate electrode overlapping the light blocking layer and disposed between the source and gate electrodes.

According to at least one embodiment of the invention, a display device is provided that prevents pixels in a step shape disposed at a border of a display area from being viewed from the outside.

BRIEF DESCRIPTION OF THE DRAWINGS

FIG. 17 is a diagram illustrating a state where an area adjacent to a curved section is filled with a dummy unit.

DETAILED DESCRIPTION OF THE EXEMPLARY EMBODIMENTS

Figure 1:
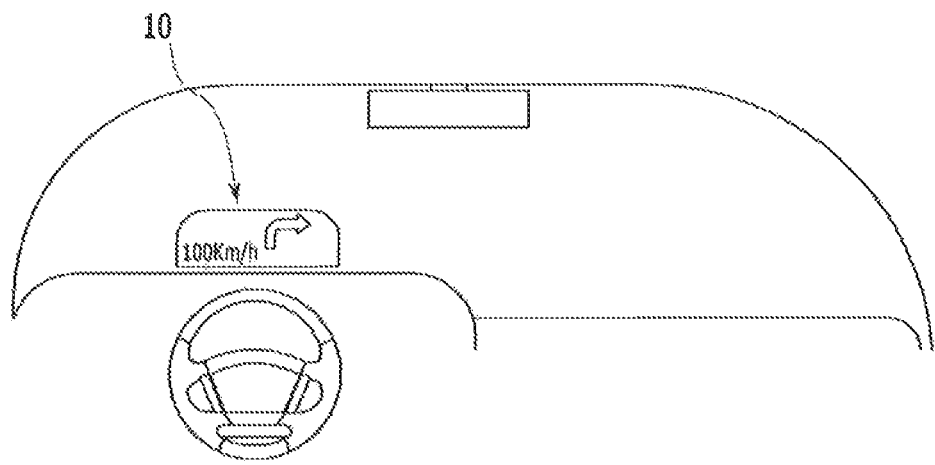
FIG. 1 is a diagram illustrating an internal side of a vehicle, in which a display device according to an exemplary embodiment of the invention may be installed.

In the following detailed description, only certain exemplary embodiments have been shown and described, simply by way of illustration. As those skilled in the art would realize, the described embodiments may be modified in various different ways, all without departing from the spirit or scope of the invention concept. Like reference numerals designate like elements throughout the specification. It will be understood that when an element such as a layer, film, region, or substrate is referred to as being "on" another element, it can be directly on the other element or intervening elements may also be present. As used herein, the singular forms, "a," "an" and "the" are intended to include the plural forms as well, unless the context clearly indicates otherwise.

Hereinafter, a display device according to an exemplary embodiment of the invention will be described with reference to FIGS. 1 to 7.

Figure 2:
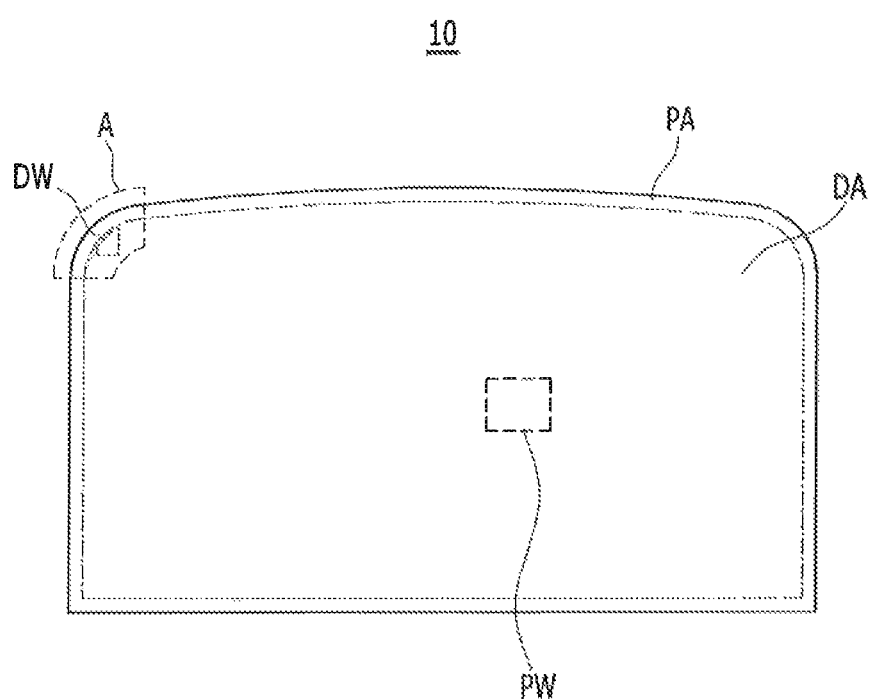
FIG. 2 is a diagram schematically illustrating a display device according to an exemplary embodiment of the invention.
Figure 3:
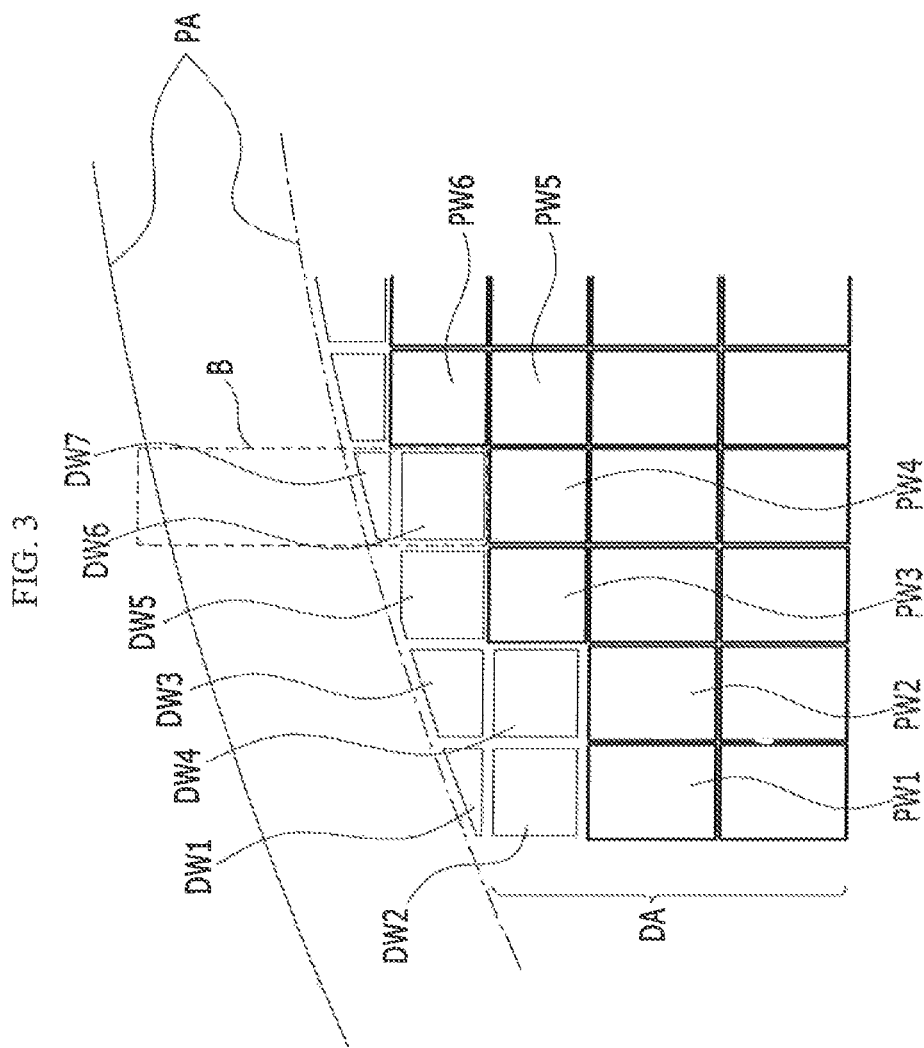
FIG. 3 is an enlarged view of region A of FIG. 2.
Figure 4:
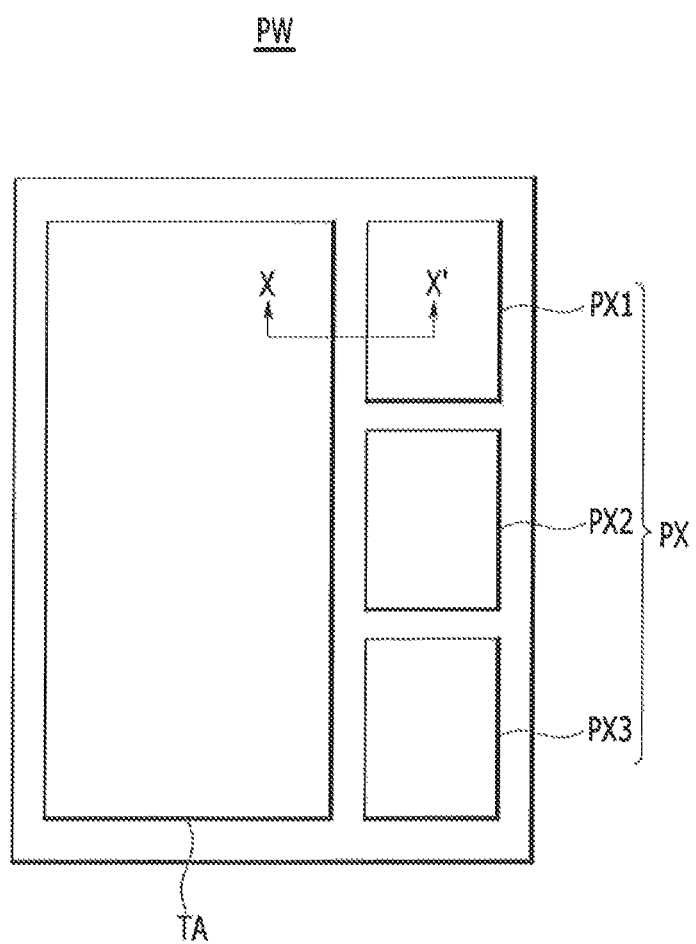
FIG. 4 is a diagram schematically illustrating one display unit of FIG. 2.
Figure 5:
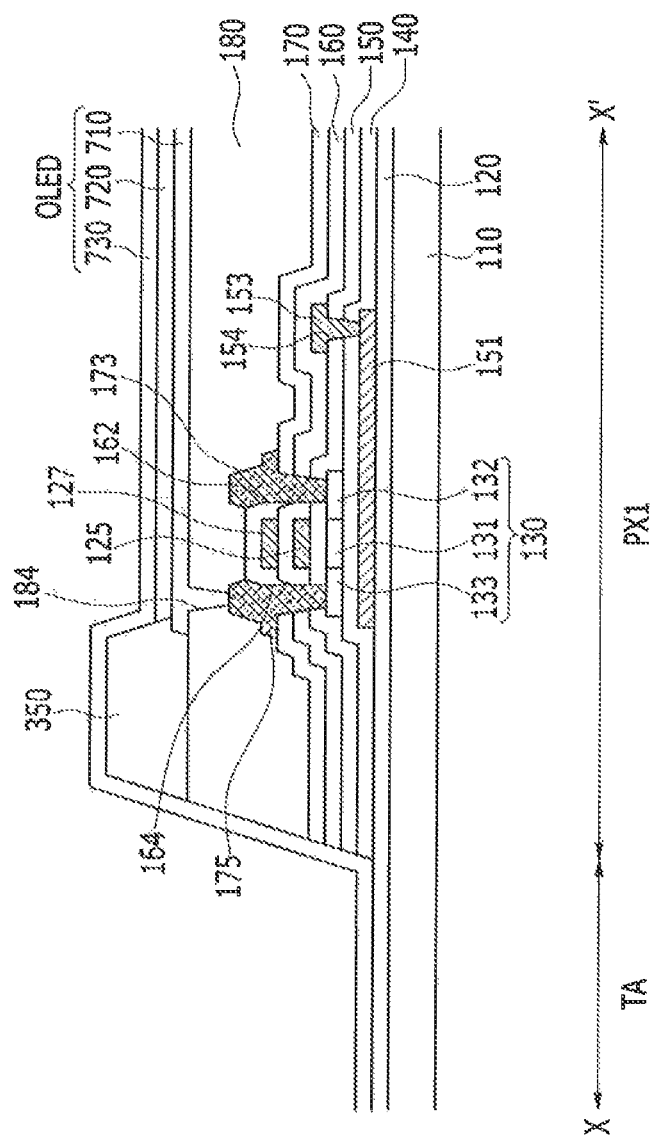
FIG. 5 is a schematic cross-sectional view of the display unit of FIG. 4 taken along line X-X'.
Figure 6:
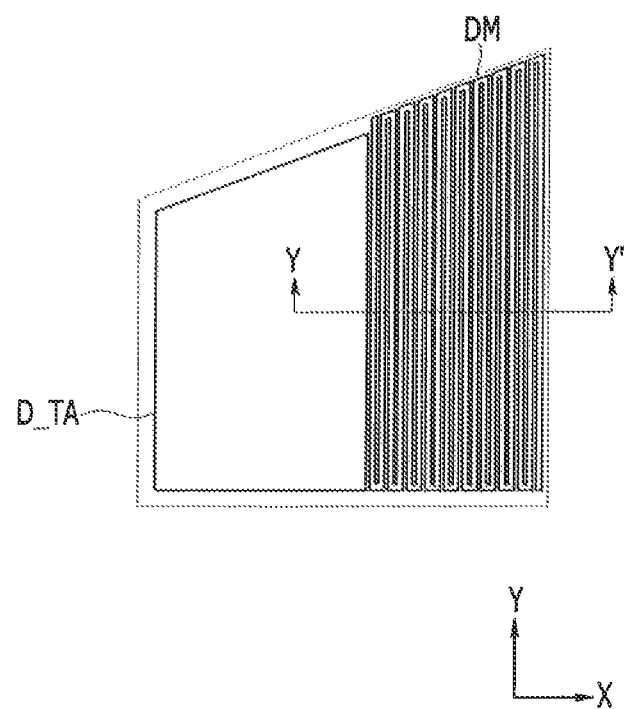
FIG. 6 is a diagram schematically illustrating one dummy unit of FIG. 2.
Figure 7:
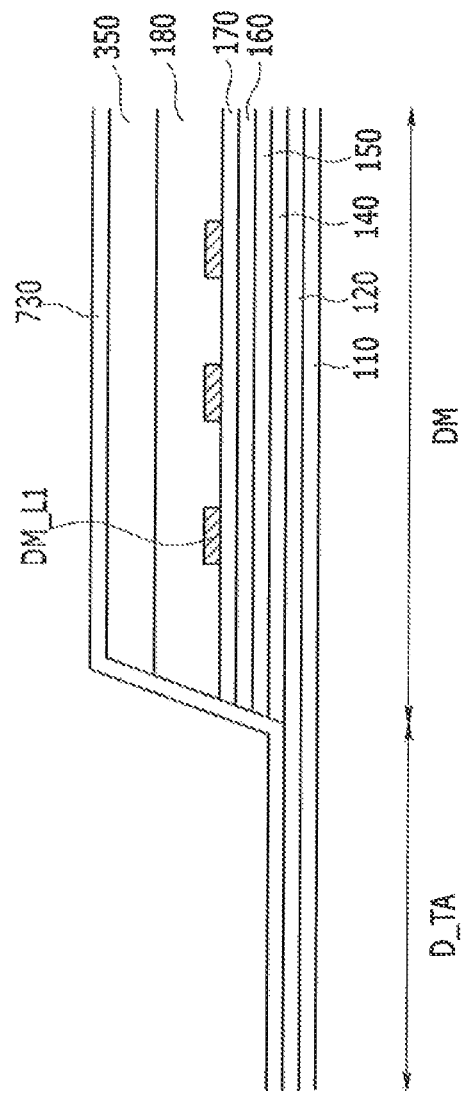
FIG. 7 is a cross-sectional view of the dummy unit of FIG. 6 taken along line Y-Y'.

FIG. 1 is a diagram illustrating an internal side of a vehicle, in which a display device according to an exemplary embodiment of the invention is installed, FIG. 2 is a diagram schematically illustrating a display device according to an exemplary embodiment of the invention, and FIG. 3 is an enlarged view of region A of FIG. 2. FIG. 4 is a diagram schematically illustrating one display unit of FIG. 2, and FIG. 5 is a schematic cross-sectional view of the display unit of FIG. 4 taken along line X-X'. FIG. 6 is a diagram schematically illustrating one dummy unit of FIG. 2, and FIG. 7 is a cross-sectional view of the dummy unit of FIG. 6 taken along line Y-Y'.

Referring to FIGS. 1 to 3, a display device 10 according to an exemplary embodiment of the invention includes a substrate 110 (see FIG. 5), a display unit PW, and a dummy unit DW. The display device 10 of the present exemplary embodiment is a transparent display device, and may be installed on a dashboard of a vehicle and display information, such as a speed and direction, to a driver.

In the present exemplary embodiment, in an area adjacent to a curved section formed at a corner of one side of the display device 10, one or more dummy units DW are disposed in a space between a peripheral area PA and the display unit PW. In this embodiment, the dummy unit DW includes a second transmissive area D_TA (see FIG. 6) and a dummy wire area DM (see FIG. 6), and the second transmissive area D_TA (see FIG. 6) has the same lamination structure as that of a first transmissive area TA (see FIG. 4) of the display unit PW, and the dummy wire area DM (see FIG. 6) is positioned on the same layer and includes the same material as that of any one wire among the wires disposed within the display unit PW. That is, the dummy unit DW having a similar structure to that of the display unit PW is filled in the space between the peripheral area PA and the display unit PW, so that a border of the display unit PW in a step shape in the space is prevented from being viewed from the outside.

The display area DA may include a plurality of display units PW, which each emit light. In an embodiment, the plurality of display units PW are arranged in a lattice or matrix form within the display area DA. Accordingly, the display area DA may be mostly filled with the plurality of display units PW. However, as described above, the area adjacent to the curved section of the display device 10 has a vacant space, which is not filled with the display units PW, as illustrated in FIG. 3. The reason is that each of the plurality of display units PW is approximately formed in a quadrangular shape, so that each of the plurality of display units PW cannot be completely filled in the area adjacent to the curved section.

Referring to FIG. 4, each of the plurality of display units PW includes the first transmissive area TA and a pixel area PX. The first transmissive area TA is an area allowing external light to pass through as it is. Due to the first transmissive area TA, the display device 10 of the present exemplary embodiment may be generally recognized as a transparent display device. In the present exemplary embodiment, it is described that the first transmissive area TA is formed of a single transmissive area, but the first transmissive area TA is not limited thereto, and may also be formed of two or more transmissive areas.

In an embodiment, the pixel area PX, which is capable of emitting light, is disposed adjacent to the first transmissive area TA. In an embodiment, the pixel area PX includes a first pixel PX1, a second pixel PX2, and a third pixel PX3. In this embodiment, the first pixel PX1, the second pixel PX2, and the third pixel PX3 may emit light of different colors. For example, the first pixel PX1 may display blue, the second pixel PX2 may display green, and the third pixel PX3 may display red. In an exemplary embodiment, the pixel represents a minimum unit, which is capable of emitting light of one color.

However, the pixel is not limited thereto. For example, the first pixel PX1, the second pixel PX2, and the third pixel PX3 may display various different colors, respectively. Further, the pixel area PX may also additionally include additional pixels displaying other colors, in addition to the first pixel PX1, the second pixel PX2, and the third pixel PX3.

The first pixel PX1, the second pixel PX2, and the third pixel PX3 may have different sizes. Here, the sizes of the first pixel PX1, the second pixel PX2, and the third pixel PX3 may represent emission areas of the first pixel PX1, the second pixel PX2, and the third pixel PX3. In FIG. 4, it is illustrated that the sizes of the first pixel PX1, the second pixel PX2, and the third pixel PX3 are the same, but the present invention is not limited thereto, and the sizes of the first pixel PX1, the second pixel PX2, and the third pixel PX3 may be variously changed. For example, the first pixel PX1 may be formed to be largest, and the third pixel PX3 may be formed to be smallest.

In an exemplary embodiment, a display unit PW is referred to as a normal pixel that includes a transmissive area TA and sub-pixels PX1, PX2, and PX3, where a sub-pixel represents a minimum unit, which is capable of emitting color, and the sub-pixels together may be referred to as a pixel area or a sub-pixel area. While FIG. 4 shows three sub-pixels in this embodiment, there may be fewer sub-pixels, such as only one sub-pixel or two sub-pixels.

Hereinafter, a lamination structure of the first transmissive area TA and the pixel area PX of FIG. 4 will be described with reference to FIG. 5. More particularly, FIG. 5 illustrates a lamination structure of the first transmissive area TA and the first pixel area PX1 of FIG. 4 and embodiments of the present invention will be described based on the lamination structure.

Referring to FIG. 5, the display device 10 of the present exemplary embodiment is an organic light emitting diode (OLED) display including an organic light emitting diode. However, the display device 10 of the present exemplary embodiment is not limited thereto, and may instead be a liquid crystal display.

The substrate 110 is an insulating substrate. In an embodiment, the substrate is formed of glass and plastic, and is formed of a transparent material. The substrate 110 may be flexible, stretchable, foldable, bendable, or rollable. The substrate 110 may be flexible, stretchable, foldable, bendable, or rollable, so that the display device 10 may be flexible, stretchable, foldable, bendable, or rollable.

The substrate 110 includes the first transmissive area TA and the first pixel PX1. As described above, the first transmissive area TA is an area allowing external light to pass through as it is, and the first pixel PX1 corresponds to an area (e.g., a pixel area), which is capable of emitting light of a specific color.

A buffer layer 120 is formed on the substrate 110. In an embodiment, the buffer layer 120 is formed of a single layer of silicon nitride (SiNx) or has a multi-layer structure, in which silicon nitride and silicon oxide (SiOx) are laminated. The buffer layer 120 serves to prevent unnecessary ingredients, such as impurities or moisture, from permeating and planarize a surface of the substrate 110. However, the buffer layer 120 may be omitted in alternate embodiments. The buffer layer 120 is positioned within both the first pixel PX1 and the first transmissive area TA. In an embodiment, the buffer layer 120 is positioned on an entire upper surface of the substrate 110.

A shading electrode 151 is positioned on the buffer layer 120. The shading electrode 151 may perform a function of a light blocking film. That is, the shading electrode 151 may prevent outside light from reaching a semiconductor layer 130, thereby preventing a characteristic of the semiconductor layer 130 from being degraded and controlling a leakage current of a thin film transistor. However, the shading electrode 151 may also be omitted according to the type of thin film transistor disposed within the first pixel PX1.

A first insulating layer 140 covering the shading electrode 151 is positioned on the buffer layer 120. The first insulating layer 140 is positioned between the shading electrode 151 and the semiconductor layer 130 and causes the shading electrode 151 and the semiconductor layer 130 be spaced apart from each other. The first insulating layer 140 may be formed of the same material as that of the buffer layer 120. For example, the first insulating layer 140 may be formed of a single layer of silicon nitride or have a multi-layer structure, in which silicon nitride and silicon oxide are laminated.

The semiconductor layer 130 is positioned on the first insulating layer 140 while overlapping the shading electrode 151. The semiconductor layer 130 may be formed of a polycrystalline semiconductor material or an oxide semiconductor material. The semiconductor layer 130 includes a channel region 131, and a source region 132 and a drain region 133, which are positioned at both sides of the channel region 131 and are doped with impurities. The kind of impurities may be changed according to the kind of thin film transistor.

A second insulating layer 150, which covers the semiconductor layer 130, is positioned on the semiconductor layer 130 and the first insulating layer 140. The second insulating layer 150 is positioned between the semiconductor layer 130 and a first gate electrode 125, and insulates the semiconductor layer 130 and the first gate electrode 125 from each other. The second insulating layer 150 may be formed of the same material as that of the first insulating layer 140. For example, the second insulating layer 150 may be formed of a single layer of silicon nitride or have a multi-layer structure, in which silicon nitride and silicon oxide are laminated.

The first gate electrode 125 overlapping the semiconductor layer 130 is disposed on the second insulating layer 150. The first gate electrode 125 may overlap at least a part of the semiconductor layer 130, particularly, the channel region 131.

A first through-hole 154, through which a part of the shading electrode 151 is exposed, is formed in the first insulating layer 140 and the second insulating layer 150. A connection member 153 is positioned on the second insulating layer 150, so that the connection member 153 and the shading electrode 151 are in contact with each other through the first through-hole 154. In this case, the connection member 153 may be positioned on the same layer as that of the first gate electrode 125. That is, the connection member 153 may be formed of the same material as that of the first gate electrode 125. However, the connection member 153 is not limited thereto, and may also include a different metal from that of the first gate electrode 125.

A first gate insulating layer 160 covering the first gate electrode 125 and the connection member 153 is positioned on the second insulating layer 150. The first gate insulating layer 160 prevent the first gate electrode 125 and the connection member 153 from being in contact with another metal layer. The first gate insulating layer 160 may also include the same material as that of the first insulating layer 140 or the second insulating layer 150. For example, the first gate insulating layer 160 may be formed of a single layer of silicon nitride or a multi-layer structure, in which silicon nitride and silicon oxide are laminated.

A second gate electrode 127 is positioned on the first gate insulating layer 160. The second gate electrode 127 overlaps the first gate electrode 125 positioned under the second gate electrode 127. However, the second gate electrode 127 may also be omitted in alternate embodiments according to the type of thin film transistor disposed within the first pixel PX1.

The second gate electrode 127 is positioned on a different layer from that of the first gate electrode 125, but may be formed of the same material as that of the first gate electrode 125. However, the second gate electrode 127 is not limited thereto, and may also be formed of a different material, that is, a different metal, from that of the first gate electrode 125. Further, a second gate insulating layer 170 covering the second gate electrode 127 is positioned on the second gate electrode 127 and the first gate insulating layer 160. The second gate insulating layer 170 may be formed of the same material as that of the first gate insulating layer 160.

A second through-hole 162 and a third through-hole 164, which exposes parts of the source region 132 and the drain region 133 of the semiconductor layer 130, respectively, are formed in the second insulating layer 150, the first gate insulating layer 160, and the second gate insulating layer 170.

A source electrode 173 and a drain electrode 175 are positioned on the second gate insulating layer 170. The source electrode 173 is in contact with the source region 132 of the semiconductor layer 130 through the second through-hole 162. Further, the drain electrode 175 is in contact with the drain region 133 of the semiconductor layer 130 through the third through-hole 164.

The semiconductor layer 130, the first gate electrode 125, the second gate electrode 127, the source electrode 173, and the drain electrode 175 form one thin film transistor. However, the configuration of the thin film transistor is not limited to the above examples, but may be variously modified. The OLED device may include a switching thin film transistor and a driving thin film transistor, and the thin film transistor may be the driving thin film transistor. Although not illustrated, the switching thin film transistor may also be further formed.

A planarizing layer 180 covering the source electrode 173 and the drain electrode 175 is positioned on the second gate insulating layer 170, the source electrode 173, and the drain electrode 175. The planarizing layer 180 may serve to remove a step and planarize the layer in order to increase emission efficiency of an organic light emitting diode OLED which is to be formed on the planarizing layer 180. Further, a fourth through-hole 184, which exposes a part of the drain electrode 175, is formed in the planarizing layer 180.

The planarizing layer 180 may be made of acrylic resin, epoxy resin, phenolic resin, polyamides resin, polyimides resin, unsaturated polyester resin, poly phenylene resin, poly phenylenesulfide resin, or benzocyclobutene (BCB).

A first electrode 710 is formed on the planarizing layer 180. The first electrode 710 may be formed of a transparent conductive material, such as an indium tin oxide (ITO), an indium zinc oxide (IZO), a zinc oxide (ZnO), an indium oxide ($In_2O_3$), or a reflective metal, such as lithium (Li), calcium (Ca), fluorolithium/calcium (LiF/Ca), fluorolithium/aluminum (LiF/Al), aluminum (Al), silver (Ag), magnesium (Mg), or gold (Au).

The first electrode 710 is electrically connected with the drain electrode 175 through the fourth through-hole 184 formed in the planarizing layer 180. In an embodiment, the first electrode 710 is an anode electrode of the organic light emitting diode OLED.

A pixel defining layer 350 is positioned on borders of the planarizing layer 180 and the first electrode 710. The pixel defining layer 350 may be disposed so as to surround a border of the first pixel PX1. The pixel defining layer 350 has an opening exposing the first electrode 710.

The pixel defining layer 350 may be a resin, such as polyamide, polyacrylates, or polyimides, a siloxane-based resin, or a silica-based inorganic material.

An organic emission layer 720 is formed in the opening of the pixel defining layer 350. The organic emission layer 720 is formed with multiple layers including one or more of an emission layer, a hole injection layer (HIL), a hole transporting layer (HTL), an electron transporting layer (ETL), and an electron injection layer (EIL).

When the organic emission layer 720 includes all of the emission layer, the hole injection layer (HIL), the hole transporting layer (HTL), the electron transporting layer (ETL), and the electron injection layer (EIL), the hole injection layer may be positioned on the first electrode 710, which is the anode electrode, and the hole transporting layer, the emission layer, the electron transporting layer, and the electron injection layer may be sequentially laminated on the hole injection layer.

The organic emission layer 720 may include a red organic emission layer emitting red light, a green organic emission layer emitting green light, and a blue organic emission layer emitting blue light. The red organic emission layer, the green organic emission layer, and the blue organic emission layer are formed in a red pixel, a green pixel, and a blue pixel, respectively, to implement a color image.

Further, the organic emission layer 720 may also implement a color image by laminating all of the red organic emission layer, the green organic emission layer, and the blue organic emission layer in the red pixel, the green pixel, and the blue pixel together, and forming a red color filter, a green color filter, and a blue color filter for each pixel.

In another example, the organic emission layer 720 implements a color image by forming a white organic emission layer emitting white light in all of the red pixel, the green pixel, and the blue pixel, and forming the red color filter, the green color filter, the blue color filter for each pixel. When the organic emission layer 720 implements the color image by using the white organic emission layer and the color filters, deposition masks for depositing the red organic emission layer, the green organic emission layer, and the blue organic emission layer on the respective pixels, that is, the red pixel, the green pixel, and the blue pixel, are not used.

The white organic emission layer described in another example may be formed of one organic emission layer, and include a configuration in which a plurality of organic emission layers is laminated to emit white light. For example, the white organic emission layer may also include a configuration in which at least one yellow organic emission layer and at least one blue organic emission layer are combined to emit white light, a configuration in which at least one cyan organic emission layer and at least one red organic emission layer are combined to emit white light, or a configuration in which at least one magenta organic emission layer and at least one green organic emission layer are combined to emit white light.

A second electrode 730 is positioned on the pixel defining layer 350 and the organic emission layer 720. In the present exemplary embodiment, the second electrode 730 is positioned in the first pixel PX1 and the first transmissive area TA.

The second electrode 730 may be formed of a transparent conductive material, such as an indium tin oxide (ITO), an indium zinc oxide (IZO), a zinc oxide (ZnO), an indium oxide, or a reflective metal, such as lithium (Li), calcium (Ca), fluorolithium/calcium (LiF/Ca), fluorolithium/aluminum (LiF/Al), aluminum (Al), silver (Ag), magnesium (Mg), or gold (Au). In an embodiment, the second electrode 730 is a cathode electrode of the organic light emitting diode OLED. The first electrode 710, the organic emission layer 720, and the second electrode 730 form the organic light emitting diode OLED.

The aforementioned thin film transistor, first insulating layer 140, second insulating layer 150, first gate insulating layer 160, second gate insulating layer 170, planarizing layer 180, first electrode 710, and organic emission layer 720 are positioned within the first pixel PX1, and are not positioned in the first transmissive area TA. The buffer layer 120 is positioned on the first transmissive area TA of the substrate 110, and the second electrode 730 may be positioned just on the buffer layer 120. Accordingly, the second electrode 730 is in contact with the buffer layer 120 within the first transmissive area TA. Other layers, except for the buffer layer 120 and the second electrode 730, are not formed in the first transmissive area TA of the substrate 110, thereby improving transmissivity of the first transmissive area TA. However, embodiments of the present invention are not limited thereto, and some layers other than the buffer layer 120 and the second electrode 730, may also be further positioned in the first transmissive area TA.

Referring to FIGS. 6 and 7, the dummy unit DW (e.g. a dummy pixel) includes the second transmissive area D_TA and the dummy wire area DM. That is, the dummy unit DW includes the second transmissive area D_TA, through which external light passes, and the dummy wire area DM formed of a dummy wire DM_L1. The dummy wire area DM is different from the pixel area PX of the display unit PW. The dummy wire area DM includes only the dummy wire DM_L1 that is a metal wire so that the dummy unit DW may be viewed from the outside in a similar structure to that of the display unit PW including the first transmissive area TA and the pixel area PX. In an embodiment, the dummy wire area DM only includes the metal wire and does not include layers sufficient to present an image that would otherwise be present in the pixel area of a normal pixel.

The second transmissive area D_TA is an area allowing external light to pass through as it is similar to the first transmissive area TA. The second transmissive area D_TA may have the same structure as that of the first transmissive area TA of the display unit PW. That is, the buffer layer 120 is positioned on the second transmissive area D_TA of the substrate 110, and the second electrode 730 is positioned just on the buffer layer 120. Accordingly, the second electrode 730 is in contact with the buffer layer 120 within the second transmissive area D_TA. As described above, other layers, except for the buffer layer 120 and the second electrode 730, are not formed in the second transmissive area D_TA of the substrate 110, thereby improving transmissivity of the second transmissive area D_TA. However, the present invention is not limited thereto, as layers other than the buffer layer 120 and the second electrode 730, may also be further positioned in the second transmissive area D_TA.

Figure 13:
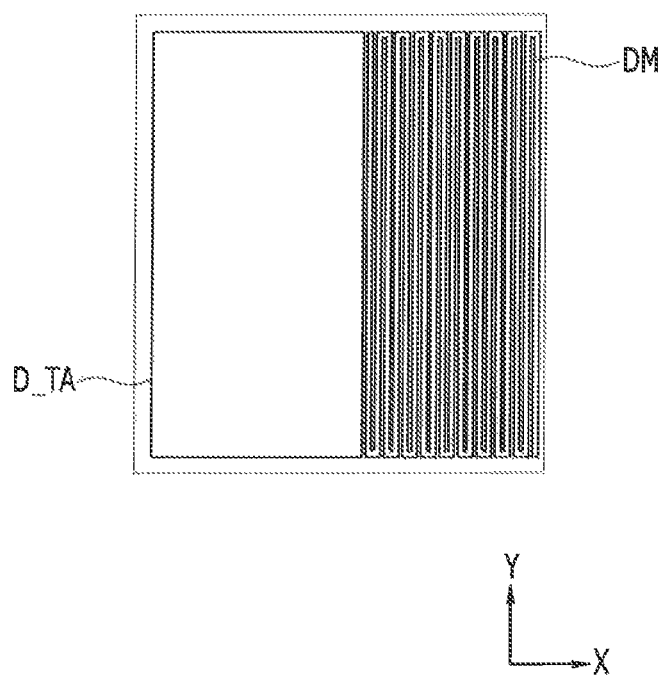
FIG. 13 is a modified example of a dummy transmissive area of FIG. 6.

In an embodiment, the dummy wire area DM is disposed around the second transmissive area D_TA. For example, a portion of a wire of the dummy area DM may entirely surround the second transmissive area TA. In another embodiment, the dummy wire area DM is disposed adjacent to the second transmissive area D_TA without a portion of the wire surrounding the second transmissive area TA. The dummy wire area DM may have a shape corresponding to a shape of the second transmissive area D_TA. For example, as illustrated in FIG. 6, the shape of the dummy wire area DM may have a trapezoid shape, similar to that of the second transmissive area D_TA. In addition, as illustrated in FIG. 13, the dummy wire area DM and the second transmissive area D_TA may also have a rectangular shape. However, the shapes of the dummy wire area DM and the second transmissive area D_TA are not limited thereto, and may have various polygonal shapes, such as a triangular shape and a pentagonal shape.

Referring back to FIG. 6, in an exemplary embodiment, a height on a plane of the dummy wire area DM is different from a height on a plane of the second transmissive area D_TA. For example, a height on a plane of the dummy wire area DM is larger than a height on a plane of the second transmissive area D_TA. Here, the height on the plane represents a length extended in a direction aligning with a Y-axis. Hereinafter, in the coordinates of the drawing, an X-axis represents a second direction, and the Y-axis represents a first direction.

The dummy wire area DM includes a dummy wire DM_L1. The dummy wire DM_L1 may extend along the Y-axis. In the present exemplary embodiment, the dummy wire DM_L1 is formed of one wire, and includes a part elongated along the Y-axis. In this case, the dummy wire DM_L1 is extended in an up direction along the Y-axis, extended in a down direction along the Y-axis, and extended in the up direction along the Y-axis again. As described above, the dummy wire DM_L1 may have a shape bent at least two times while being extended along the Y-axis. For example, the dummy wire DM_L1 may include several segments that extend in the Y-axis and several bends that connect the segments together.

Figure 11:
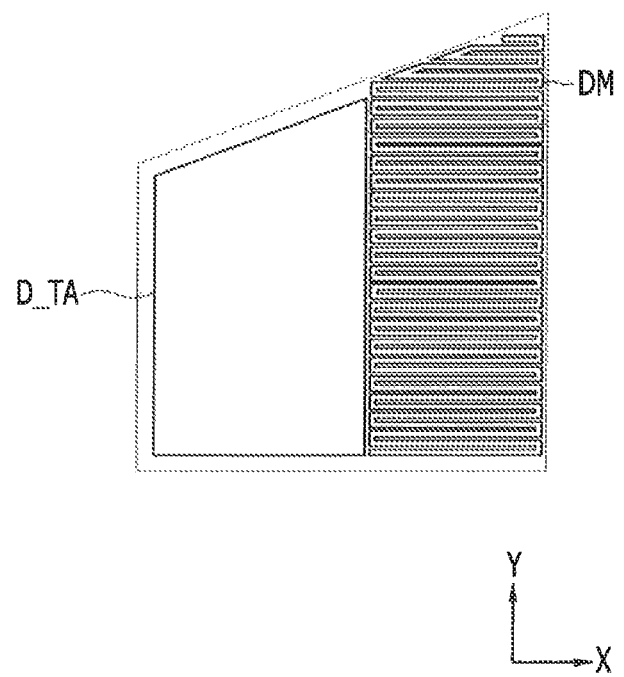
FIGS. 11 and 12 are modified examples of dummy wires of FIG. 6.
Figure 12:
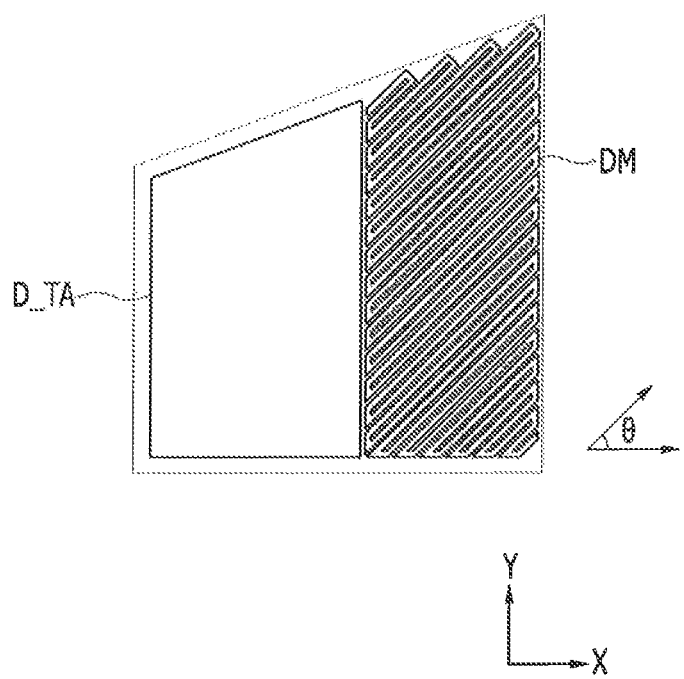

In addition to the case where the dummy wire DM_L1 is extended in parallel in the Y-axis in parallel as illustrated in FIG. 6, the dummy wire DM_L1 may also be extended in a direction other than the Y-axis direction, as illustrated in FIGS. 11 and 12. Referring to FIG. 11, the dummy wire DM_L1 is disposed while being extended along the X-axis. That is, unlike FIG. 6, the dummy wire DM_L1 is extended along the X-axis crossing the Y-axis. For example, the dummy wire DM_L1 may include several segments that extend in the X-axis and several bends that connect the segments together.

In another embodiment, referring to FIG. 12, the dummy wire DM_L1 has a shape mainly extended while being inclined with respect to the X-axis at a predetermined angle θ. In this embodiment, the angle θ is greater than 0° and less than 90°. That is, as illustrated in FIG. 6 or 11, the dummy wire DM_L1 does not extend in the X-axis or the Y-axis in parallel, but extends while being inclined.

It is described that the dummy wire DM_L1 of FIGS. 6, 11, and 12 is formed of one metal wire, but embodiments of the inventive are not limited thereto. For example, a plurality of dummy wires DM_L1 may be disposed while extending along the Y-axis in parallel. In an embodiment, the plurality of dummy wires DM_L1 are disposed while being extended along the X-axis in parallel. In an embodiment, the plurality of dummy wires DM_L1 extend while being inclined so they do not extend in parallel with the X-axis or the Y-axis. In this embodiment, the plurality of dummy wires DM_L1 that extend in the same direction are electrically connected to one another.

Referring back to FIGS. 6 and 7, in an embodiment, the dummy wire DM_L1 disposed in the dummy wire area DM is a metal wire. In the present exemplary embodiment, the dummy wire DM_L1 is disposed on the same layer as that of the metal wire disposed within the display device 10.

The dummy wire DM_L1 is disposed on the second gate insulating layer 170. In an exemplary embodiment, the dummy wire DM_L1 is disposed on the same layer as that of the source electrode 173 (see FIG. 5) and the drain electrode 175 (see FIG. 5) of the first pixel PX1. In this embodiment, when the source electrode 173 (see FIG. 5) and the drain electrode 175 (see FIG. 5) are formed, the dummy wire DM_L1 may be formed together. That is, the dummy wire DM_L1, the source electrode 173 (see FIG. 5), and the drain electrode 175 (see FIG. 5) may be simultaneously formed by depositing a metal material on the substrate 110 and patterning the metal material. Accordingly, the dummy wire DM_L1 may include the same metal material as that of the source electrode 173 (see FIG. 5) and the drain electrode 175 (see FIG. 5).

The planarizing layer 180 and the pixel defining layer 350 covering the dummy wire DM_L1 may be sequentially disposed on the second gate insulating layer 170. However, one of the planarizing layer 180 and the pixel defining layer 350 may be omitted. In this case, the planarizing layer 180 and the pixel defining layer 350 positioned in the dummy unit DW may be simultaneously formed when the planarizing layer 180 and the pixel defining layer 350 of the first pixel PX1 of the pixel area PX are formed.

The second electrode 730 may be disposed on the planarizing layer 180. The second electrode 730 of the dummy wire area DM may be disposed on the same layer as that of the second electrode 730 of the first pixel PX1 of the pixel area PX. In the present exemplary embodiment, the second electrode 730 is commonly disposed in the second transmissive area D_TA and the dummy wire area DM of the dummy unit DW.

The first gate insulating layer 160, the second insulating layer 150, and the first insulating layer 140 may be sequentially laminated under the second gate insulating layer 170. However, in an embodiment where the second gate insulating layer 170, the first gate insulating layer 160, the second insulating layer 150, and the first insulating layer 140 are omitted, the dummy wire DM_L1 is directly laminated on the buffer layer 120.

Figure 8:
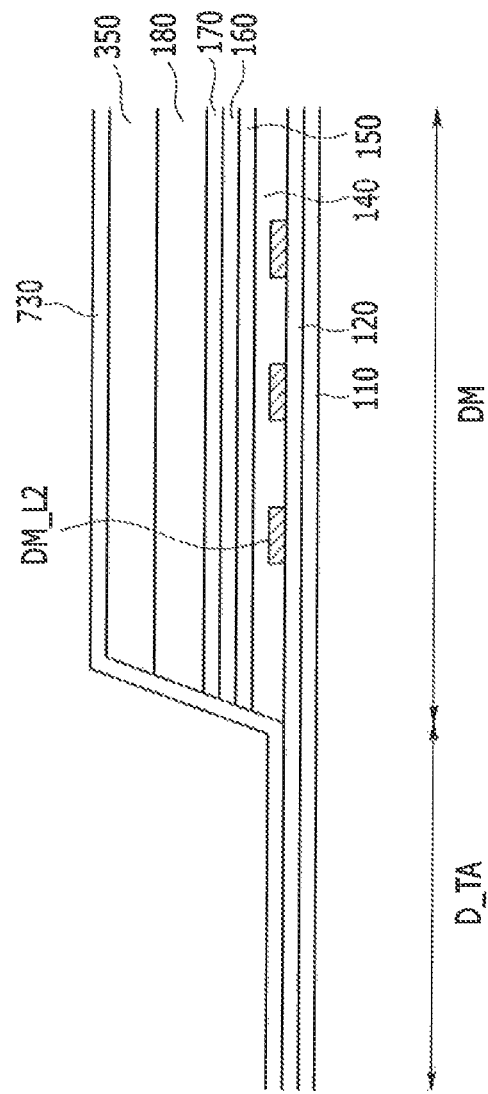
FIGS. 8 to 10 are modified examples of dummy wires of FIG. 7.

Referring to FIG. 8, a dummy wire DM_L2 is disposed on the same layer as that of the shading electrode 151 (see FIG. 5) of the first pixel PX1. That is, the dummy wire DM_L2 is disposed on the buffer layer 120. In this case, when the shading electrode 151 (see FIG. 5) is formed, the dummy wire DM_L2 may also be formed together. That is, the dummy wire DM_L2 and the shading electrode 151 (FIG. 5) may be simultaneously formed by depositing a metal material on the substrate 110 and patterning the metal material. Accordingly, the dummy wire DM_L2 may include the same metal material as that of the shading electrode 151 (FIG. 5).

Figure 9:
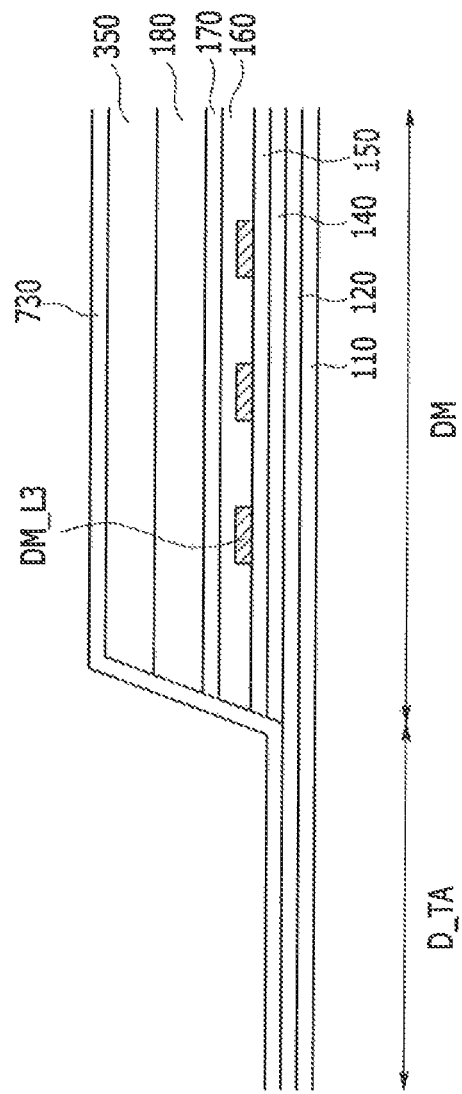

Referring to FIG. 9, a dummy wire DM_L3 is disposed on the same layer as that of the first gate electrode 125 (see FIG. 5) of the first pixel PX1. That is, the dummy wire DM_L3 is disposed on the second insulating layer 150. In this case, when the first gate electrode 125 (see FIG. 5) is formed, the dummy wire DM_L3 may also be formed together. That is, the dummy wire DM_L3 and the first gate electrode 125 (FIG. 5) may be simultaneously formed by depositing a metal material on the substrate 110 and patterning the metal material. Accordingly, the dummy wire DM_L3 may include the same metal material as that of the first gate electrode 125 (FIG. 5).

Figure 10:
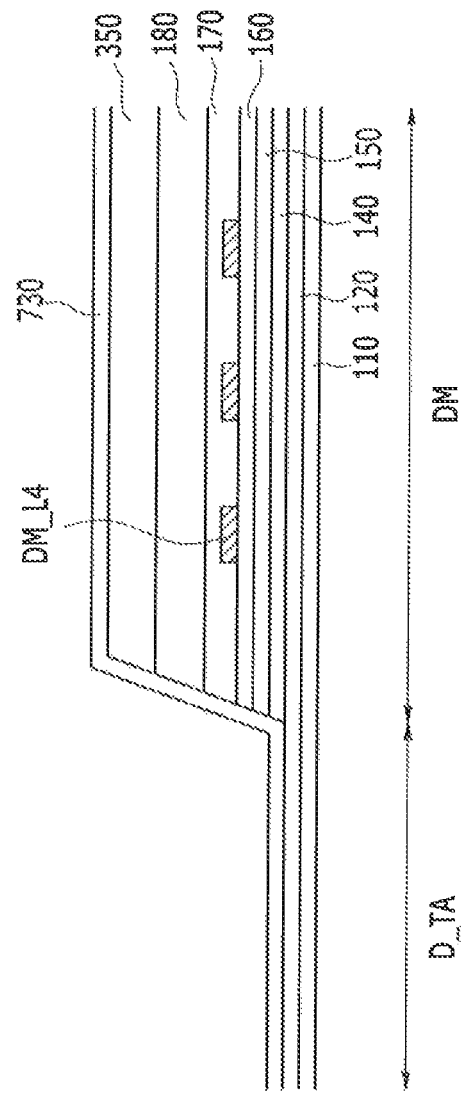

Referring to FIG. 10, a dummy wire DM_L4 is disposed on the same layer as that of the second gate electrode 127 (see FIG. 5) of the first pixel PX1. That is, the dummy wire DM_L4 is disposed on the first gate insulating layer 160. In this case, when the second gate electrode 127 (see FIG. 5) is formed, the dummy wire DM_L4 may also be formed together. That is, the dummy wire DM_L4 and the second gate electrode 127 (FIG. 5) may be simultaneously formed by depositing a metal material on the substrate 110 and patterning the metal material. Accordingly, the dummy wire DM_L4 may include the same metal material as that of the second gate electrode 127 (FIG. 5).

Figure 14:
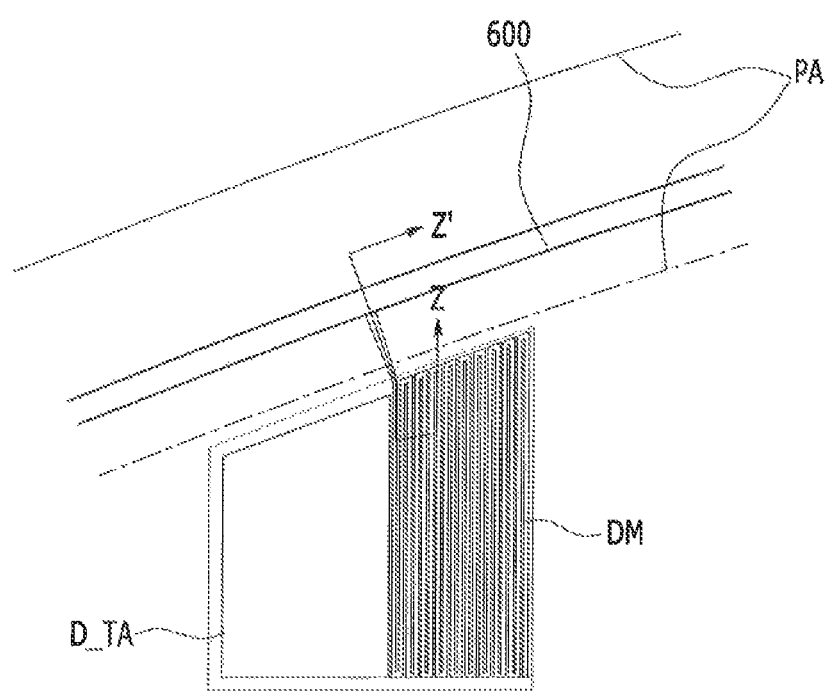
FIG. 14 is an enlarged view of region B of FIG. 3
Figure 15:
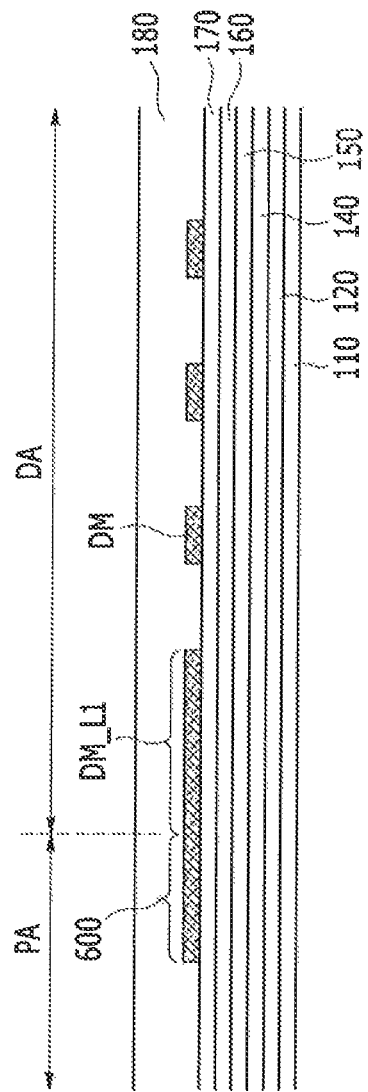
FIG. 15 is a cross-sectional view of region B of FIG. 14 taken along line Z-Z'.

Referring to FIGS. 14 and 15, the dummy wire DM_L1 of the dummy wire area DM is electrically connected with a wire 600 positioned in the peripheral area PA. In the peripheral area PA, a first power supply ELVDD (not illustrated) and a second power supply ELVSS (not illustrated) supplying driving power and common power to each of the pixels PX1, PX2, and PX3 of the display area DA may be disposed. In this case, the first power supply ELVDD (not illustrated) and the second power supply ELVSS (not illustrated) may apply corresponding voltages to each of the pixels PX1, PX2, and PX3 through a driving power line ELVDDL and a common power line ELVSSL, respectively. In an embodiment, the common power line ELVSSL provides a first voltage (e.g., a ground voltage) lower than a second voltage provided by the driving power line ELVDDL. In an embodiment, the first and second voltages are constant voltages. The wire 600 positioned in the peripheral area PA may include the driving power line ELVDDL or the common power line ELVSSL.

Accordingly, in the present exemplary embodiment, the dummy wire DM_L1 is electrically connected with the driving power line ELVDDL or the common power line ELVSSL included in the wire 600. As illustrated in FIG. 15, the dummy wire DM_L1 and the wire 600 may be disposed on the same layer. However, the dummy wire DM_L1 and the wire 600 are not limited thereto, and may also be disposed on different layers according to the type of wire 600.

Further, the wire 600 electrically connected with the dummy wire DM_L1 may include a signal line connected to a driving driver (not illustrated) positioned within the peripheral area PA.

Referring back to FIG. 3, in an area adjacent to a curved section formed at a corner of one side of the display device 10, one or more dummy units DW may be disposed in a space between a peripheral area PA and the display unit PW. That is, in the space, at least one dummy unit DW including the second transmissive area D_TA and the dummy wire area DM is disposed. As described above, the dummy unit DW having a similar structure to that of the display unit PW may be filled in the space between the peripheral area PA and the display unit PW. For example, as shown in FIG. 3, dummy units DW1, DW2, DW3, DW4, DW5, DW6, and DW7 are formed in the space above display units PW1, PW2, PW3, PW4, PW5, and PW6. For example, some of the dummy units formed far enough away from the curved surface may have a quadrangular shapes and the rest formed near to the curved surface may have various other shapes to fill some or all of the remaining space.

Figure 16:
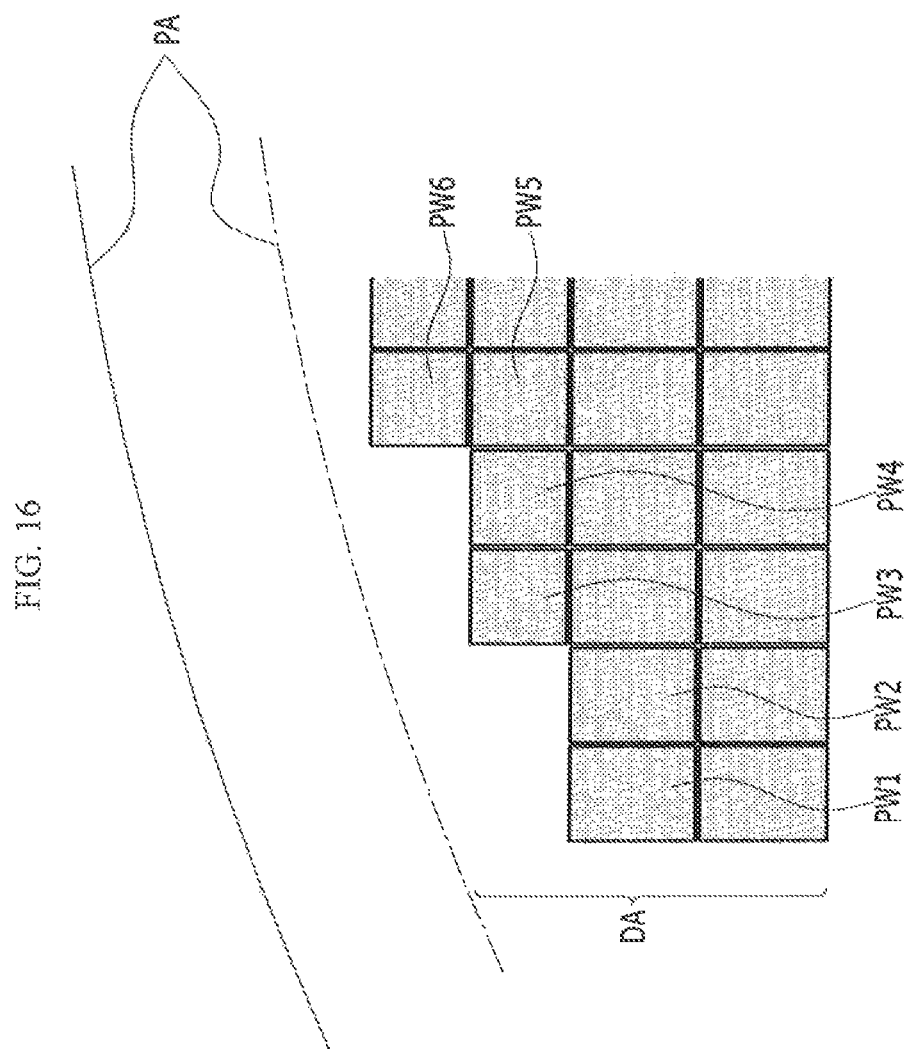
FIG. 16 is a diagram illustrating a state where an area adjacent to a curved section is vacant.

Next, referring to FIGS. 16 and 17, it can be seen that the dummy unit DW is disposed in the space between the peripheral area PA and the display unit PW, so that it is possible to prevent a step shaped border of the display units PW from being viewed from the outside.

FIG. 16 is a diagram illustrating a state where an area adjacent to a curved section is vacant, and FIG. 17 is a diagram illustrating a state where an area adjacent to the curved section is filled with the dummy units.

Referring to FIG. 16, when the dummy units DW of the present exemplary embodiment are not disposed adjacent to the peripheral area PA, vacant spaces may be formed between an internal boundary line of the peripheral area PA and the display units PW1, PW2, PW3, PW4, PW5, and PW6. Herein, the vacant space represents an area, in which the display units PW, each including the first transmissive area TA and the pixel area PX, are not disposed.

In this case, borders of the display units PW1, PW2, PW3, PW4, PW5, and PW6 close to the internal boundary line of the peripheral area PA may have a step shape. When the dummy units DW are not disposed in the vacant space, the borders of the display units PW1, PW2, PW3, PW4, PW5, and PW6 may be relatively clearly viewed in a step shape when viewed from the outside.

Referring to FIG. 17, when the dummy units DW having the similar structure to that of the display units PW are disposed in the vacant space, the step shape, that is the shape of the borders of the display units PW1, PW2, PW3, PW4, PW5, and PW6 illustrated in FIG. 16, cannot be viewed well from the outside. Accordingly, in the display device 10 according to the present exemplary embodiment, the step shape formed by the border of the display units PW represented in the vacant space may not be viewed well from the outside.

While this invention has been described in connection with various exemplary embodiments, it is to be understood that the invention is not limited to the disclosed embodiments, but, on the contrary, is intended to cover various modifications and equivalent arrangements included within the spirit and scope of this disclosure.

What is claimed is:

1. A display device, comprising:
   a substrate including a display area and a peripheral area positioned adjacent the display area;
   a first dummy pixel disposed on the substrate, adjacent to the peripheral area;
   a second dummy pixel disposed on the substrate, and disposed between the peripheral area and the first dummy pixel,
   wherein the first dummy pixel comprises:
      a first transmissive area; and
      a first wire area disposed adjacent the first transmissive area,
   wherein the second dummy pixel comprises:
      a second transmissive area; and
      a second wire area disposed adjacent the second transmissive area,
   wherein a size of the first transmissive area is different than a size of the second transmissive area.

2. The display device of claim 1, wherein the first transmissive area has a quadrangular plane shape.

3. The display device of claim 1, wherein the second transmissive area has a trapezoid plane shape or triangle plane shape.

4. The display device of claim 1, wherein the first wire area includes a first wire and the second wire area includes a second wire.

5. The display device of claim 4, wherein the first transmissive area extends in a first direction, and the first wire extends in the first direction and the second transmissive area extends in a first direction, and the second wire extends in the first direction.

6. The display device of claim 4, wherein the first wire comprises a plurality of parallel wire segments and the second wire comprises a plurality of parallel wire segments.

7. The display device of claim 4, wherein the first wire and the second wire have a shape bent two or more times.

8. The display device of claim 4, wherein the first transmissive area extends in a first direction, and the first wire extends in a second direction crossing the first direction, and the second transmissive area extends in a first direction, and the second wire extends in a second direction crossing the first direction.

9. The display device of claim 4, wherein the first transmissive area extends in a first direction, and the first wire is inclined at an angle with respect to the first direction, and the second transmissive area extends in a first direction, and the second wire is inclined at an angle with respect to the first direction.

10. A display device, comprising:
    a substrate including a emission area, a peripheral area positioned adjacent the emission area, a dummy area disposed between the emission area and the peripheral area;
    a plurality of emission pixels disposed within the emission area on the substrate, where each of the emission pixels comprises a transmissive area and an emission area disposed adjacent the transmissive area; and
    a first dummy pixel and a second dummy pixel disposed within the dummy area on the substrate,
    wherein the first dummy pixel comprises:
       a first transmissive area; and
       a first wire area disposed adjacent the first transmissive area,
    wherein the second dummy pixel comprises:
       a second transmissive area; and
       a second wire area disposed adjacent the second transmissive area,
    wherein a size of the first transmissive area is larger than a size of the second transmissive area.

11. The display device of claim 10, wherein the emission pixels are disposed closer to the first transmissive area than the second transmissive area.

12. The display device of claim 10, further include a signal line positioned in the peripheral area, wherein the second transmissive area is disposed closer to the signal line than the emission area.

13. A display device, comprising:
    a substrate;
    a plurality of display units disposed on the substrate, where each display unit comprises a first transmissive area allowing external light to pass through, and a pixel area disposed adjacent the first transmissive area; and
    a plurality of dummy units disposed on the substrate surrounding the plurality of display units, where each dummy unit comprises a plurality of dummy wires,
    wherein the pixel area includes a first electrode layer, an organic emission layer, a second electrode layer, and a pixel defining layer, and the first transmissive area includes the second electrode layer without the first electrode layer, the organic emission layer, and the pixel defining layer,
    wherein each dummy wire has a shape bent at least two times while extended along a first direction.

14. The display device of claim 13, wherein the first transmissive area has a quadrangular plane shape.

15. The display device of claim 13, wherein the pixel defining layer is a resin or a silica-based inorganic material.

16. The display device of claim 13, further comprising a buffer layer disposed on the substrate, and the second electrode layer contacts the buffer layer in the first transmissive area.

17. The display device of claim 16, wherein the buffer layer includes silicon nitride.

18. The display device of claim 16, wherein the dummy wires are directly laminated on the buffer layer.

\* \* \* \* \*